US008835309B2

(12) United States Patent
Hilscher et al.

(10) Patent No.: US 8,835,309 B2
(45) Date of Patent: Sep. 16, 2014

(54) FORMING NICKEL—PLATINUM ALLOY SELF-ALIGNED SILICIDE CONTACTS

(75) Inventors: David F. Hilscher, Poughkeepsie, NY (US); Christian Lavoie, Ossining, NY (US); Ahmet S. Ozcan, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 62 days.

(21) Appl. No.: 13/613,579

(22) Filed: Sep. 13, 2012

(65) Prior Publication Data

US 2014/0073130 A1  Mar. 13, 2014

(51) Int. Cl.
  H01L 21/4763 (2006.01)
  H01L 21/44 (2006.01)
  H01L 31/00 (2006.01)
  H01L 23/48 (2006.01)

(52) U.S. Cl.
  USPC .......... 438/648; 438/649; 438/651; 438/655; 438/660; 438/663; 257/455; 257/456; 257/757; 257/768

(58) Field of Classification Search
  USPC ......... 438/648–651, 655, 656, 660, 663, 682, 438/683; 257/455, 456, 757, 768, 769
  See application file for complete search history.

(56) References Cited

U.S. PATENT DOCUMENTS

| 7,390,754 | B2 | 6/2008 | Chang et al. |
| 7,544,610 | B2 | 6/2009 | Cabral, Jr. et al. |
| 7,618,891 | B2 | 11/2009 | Fang et al. |
| 7,682,917 | B2 | 3/2010 | Bedell et al. |
| 8,076,239 | B2 | 12/2011 | Kawamura et al. |
| 2006/0266737 | A1 | 11/2006 | Hanestad et al. |
| 2007/0020925 | A1 | 1/2007 | Hsieh et al. |
| 2008/0073713 | A1 | 3/2008 | Kim et al. |
| 2009/0039423 | A1 | 2/2009 | Ikeda |
| 2009/0309228 | A1* | 12/2009 | Fang et al. ............ 257/769 |
| 2011/0212550 | A1* | 9/2011 | Libbert et al. ............ 438/16 |
| 2011/0248343 | A1* | 10/2011 | Guo et al. ............ 257/347 |
| 2012/0018816 | A1 | 1/2012 | Sen et al. |

OTHER PUBLICATIONS

E. Alptekin et al., "Tuning of the Platinum Silicide Schottky Barrier Height on n-Type Silicon by Sulfur Segregation," IEEE Electron Device Letters, vol. 30, No. 4, Apr. 2009, pp. 331-333.
F. Goh et al., "Challenges in Nickel Platinum Silicide Wet Etching for Sub-65nm Device Technology," ECS Trans., vol. 11, No. 2, 2007, pp. 321-326.

* cited by examiner

Primary Examiner — Hsien Ming Lee
(74) Attorney, Agent, or Firm — Cantor Colburn LLP; Catherine Ivers

(57) ABSTRACT

A method of performing a silicide contact process comprises a forming a nickel-platinum alloy (NiPt) layer over a semiconductor device structure; performing a first rapid thermal anneal (RTA) so as to react portions of the NiPt layer in contact with semiconductor regions of the semiconductor device structure, thereby forming metal rich silicide regions; performing a first wet etch to remove at least a nickel constituent of unreacted portions of the NiPt layer; performing a second wet etch using a dilute Aqua Regia treatment comprising nitric acid ($HNO_3$), hydrochloric acid (HCl) and water ($H_2O$) to remove any residual platinum material from the unreacted portions of the NiPt layer; and following the dilute Aqua Regia treatment, performing a second RTA to form final silicide contact regions from the metal rich silicide regions.

17 Claims, 6 Drawing Sheets

FORMING NICKEL—PLATINUM ALLOY SELF-ALIGNED SILICIDE CONTACTS

BACKGROUND

The present disclosure relates generally to semiconductor device manufacturing techniques and, more particularly, to forming nickel-platinum (NiPt) alloy self-aligned silicide contacts.

In the manufacture of semiconductor devices, salicide (or self-aligned silicide) materials are formed upon gate conductors and diffusion regions to reduce the line resistance of a CMOS device, thereby improving the speed characteristics thereof. In salicide technology, a refractory metal or a near noble metal, such as titanium for example, is deposited on a silicon substrate. The deposited metal is then annealed, thereby forming a silicide layer only on the exposed areas of the substrate. The areas of unreacted metal left on the dielectric may then be selectively etched away without a masking step. Thus, the process is "self-aligning."

As circuit devices have continued to shrink in size, however, it has been found that titanium silicide ($TiSi_2$) becomes an unsatisfactory silicide material since the sheet resistance thereof begins to sharply increase when the linewidth of the device decreases below 0.20 microns ($\mu m$). More recently, cobalt disilicide ($CoSi_2$) has been used as a replacement for titanium in salicide structures since it does not suffer from a linewidth dependent sheet resistance problem. On the other hand, the use of cobalt silicide structures is not without its own drawbacks. For example, unlike titanium, a cobalt layer requires a cap layer such as titanium nitride (TiN) due to the sensitivity of cobalt to contaminants during the annealing process.

Attention has also recently turned to nickel (Ni) as a silicide metal. Among silicide constituents, nickel silicide is considered important to the development of manufacturing processes in 65 nanometer (nm) MOSFET technology and beyond because of characteristics such as low electrical resistivity, low silicon consumption, good resistance behavior in narrow lines, and low processing temperature.

Typically, forming nickel silicide contacts includes forming a nickel metal layer on a semiconductor wafer. A first rapid thermal anneal (RTA) process is then performed to react nickel with silicon to produce nickel-rich silicide. Typically $Ni_2Si$ is the first metal-rich phase that nucleates. Thereafter, a selective etching process is performed to remove the portions of the nickel metal layer that are not reacted (i.e., those portions formed on insulating layer). A second rapid thermal anneal process is then performed to complete the fabrication of the nickel silicide, which forms the low resistance NiSi phase.

However, because nickel monosilicide (NiSi) (also referred to generally as "nickel silicide") has low thermal stability, some nickel material may penetrate through the interface between metal and silicon down to the gate electrode to cause a spiking effect. It is also possible for nickel material to laterally diffuse to the channel region, to causing a nickel "piping" effect. To improve the thermal stability of nickel silicide, several approaches have been proposed, including the use of nickel alloys, and in particular nickel-platinum (NiPt) alloys. Platinum is a noble metal element with stable chemistry properties, and is helpful to improve the thermal stability of nickel silicide. On the other hand, platinum is also a difficult metal to etch, which may results in platinum residue being present following the removal of the unreacted metal layer.

SUMMARY

In an exemplary embodiment, a method of performing a silicide contact process comprises a forming a nickel-platinum alloy (NiPt) layer over a semiconductor device structure; performing a first rapid thermal anneal (RTA) so as to react portions of the NiPt layer in contact with semiconductor regions of the semiconductor device structure, thereby forming metal rich silicide regions; performing a first wet etch to remove at least a nickel constituent of unreacted portions of the NiPt layer; performing a second wet etch using a dilute Aqua Regia treatment comprising nitric acid ($HNO_3$), hydrochloric acid (HCl) and water ($H_2O$) to remove any residual platinum material from the unreacted portions of the NiPt layer; and following the dilute Aqua Regia treatment, performing a second RTA to form final silicide contact regions from the metal rich silicide regions.

In another embodiment, a method of forming a semiconductor device includes forming a field effect transistor (FET) device on a substrate; forming a nickel-platinum alloy (NiPt) layer over the FET device and the substrate; performing a first rapid thermal anneal (RTA) so as to react portions of the NiPt layer in contact with semiconductor regions of the FET device, thereby forming metal rich silicide regions; performing a first wet etch to remove at least a nickel constituent of unreacted portions of the NiPt layer; performing a second wet etch using a dilute Aqua Regia treatment comprising nitric acid ($HNO_3$), hydrochloric acid (HCl) and water ($H_2O$) to remove any residual platinum material from the unreacted portions of the NiPt layer; and following the dilute Aqua Regia treatment, performing a second RTA to form final silicide contact regions from the metal rich silicide regions.

BRIEF DESCRIPTION OF THE SEVERAL VIEWS OF THE DRAWINGS

Referring to the exemplary drawings wherein like elements are numbered alike in the several Figures:

FIGS. 5-10 are a series of cross sectional views of an FET device illustrating the method operations depicted in FIG. 4, in which:

FIG. 5 illustrates the FET device following a preclean operation to remove any native oxide materials, prior to silicide metal deposition;

FIG. 6 illustrates the formation of a NiPt alloy layer over the structure of FIG. 5;

FIG. 7 illustrates the formation of metal rich silicide contact regions following a first RTA of the structure of FIG. 6;

FIG. 8 illustrates a (first wet) metal etch of unreacted portions of the NiPt layer of FIG. 7, leaving Pt residue;

FIG. 9 illustrates a (second wet) dilute Aqua Regia etch to remove the Pt residue of FIG. 8, and without attacking the metal rich silicide contact regions;

FIG. 10 illustrates the formation of final silicide contact regions following a second RTA of the structure of FIG. 9.

DETAILED DESCRIPTION

With respect to the above described use of NiPt alloys in silicide formation, a selective wet etch process which can remove unreacted NiPt, but that does not attack metal rich phase silicide, is needed. Although a sulfuric peroxide (SP) etch chemistry satisfies these requirements, the etching takes place at a relatively high temperature (e.g., >100° C.). Moreover, an SP chemistry may etch certain other metals, such as titanium nitride (TiN), at a high rate as well. Thus, a hot SP etch may be undesirable for high-k metal gate (HKMG) technologies having gate stack metals such as TiN, due to the risk of gate undercut and floating pattern defects.

Another selective etch approach currently used in the industry is to remove nickel from the unreacted NiPt layer after the first RTA using a wet etch, such as dilute nitric acid ($HNO_3$). The dilute nitric acid etch leaves platinum rich residuals, which are removed with a second etch following a second RTA. The second etch is performed using a chemistry directed to removing platinum, such as Aqua Regia (nitric and hydrochloric acid; i.e., $HNO_3$:HCl). However, this process leaves Pt residuals along the spacer sidewalls (terraces) and shallow trench isolation (STI) following the first etch, such as illustrated in the scanning electron microscope (SEM) image of FIG. 1. The Pt residuals then react with Si during the second RTA, resulting in the formation of NiPt silicide "stringers" on the gate sidewall surfaces which cause contact shorts.

Figure 2:
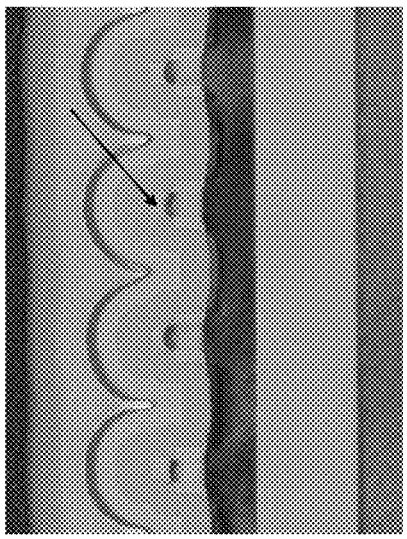
FIG. 2 is an image illustrating oxide growth in which the silicide metal from atop a transistor gate structure is leached out following a conventional strength Aqua Regia etch to remove platinum residual material following the first RTA, and prior to a second RTA.
Figure 3:
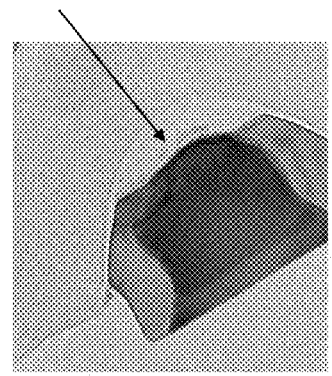
FIG. 3 is a more detailed image of the oxide growth in FIG. 2.

On the other hand, a conventional strength Aqua Regia etch to remove platinum residual material following the first RTA (and prior to the second RTA) is not selective to the metal rich silicide that forms below 350° C. Such an etch prior to the second RTA causes silicide "attack" or oxide growth in which the silicide metal is leached out. An example of this effect is illustrated in the images of FIGS. 2 and 3, in which oxide growth has resulted in regions (arrows) above transistor gate electrodes where silicide contact formation is desired.

Accordingly, disclosed herein is an improved selective wet etch process for a NiPt silicide layer that is particularly advantageous in 32/22/14 nm technology nodes that employ HKMG structures. It has been determined that a metal rich silicide surface formed after a first RTA, and thereafter passivated by a first metal etch to remove the nickel constituent of the silicide layer, can then can tolerate a short (e.g., less than 60 second) dilute Aqua Regia etch. Under typical etch conditions using this chemistry, the Aqua Regia would attack the metal rich silicide. However, the chemistries used in exemplary embodiments herein have a very low TiN etch rate (e.g., on the order of few angstroms (Å) per minute), as compared to a hot SP chemistry (that etches TiN at a rate on the order of 100's or 1000's of Å per minute). Thus, the disclosed embodiments are also compatible with HKMG technologies.

Figure 4:
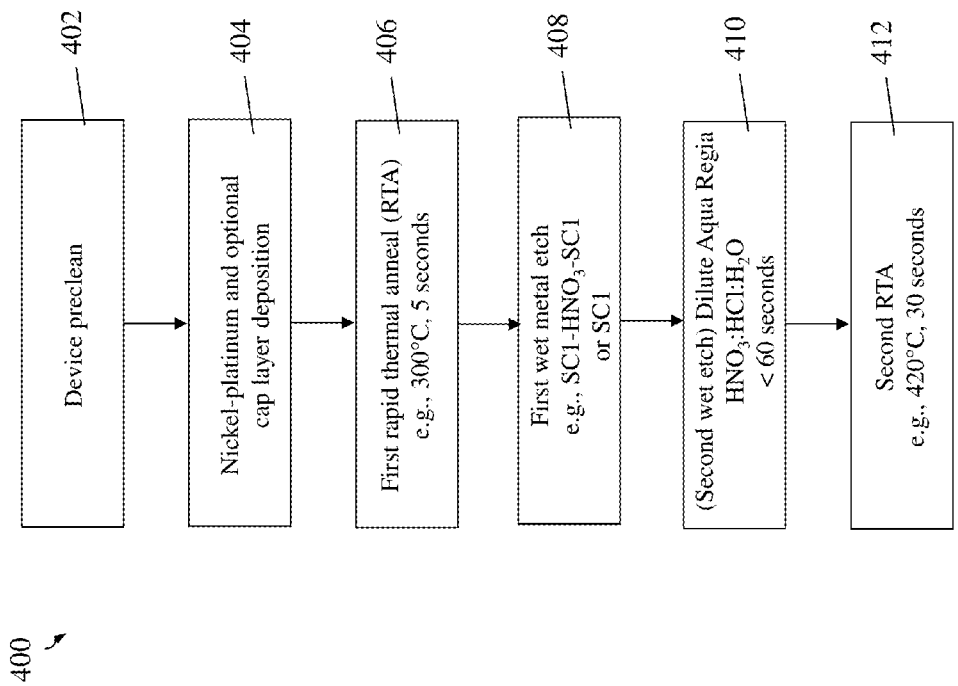
FIG. 4 is a process flow diagram illustrating a method of forming NiPt alloy silicide contacts, in accordance with an exemplary embodiment.

Referring now to FIG. 4, there is shown a process flow diagram illustrating a method 400 of forming NiPt alloy silicide contacts, in accordance with an exemplary embodiment. Individual operations of the method 400 are further illustrated with reference to FIGS. 5-10, which are a series of cross sectional views of an exemplary FET device illustrating the resulting device structure as each silicide processing operation is performed.

Figure 5:
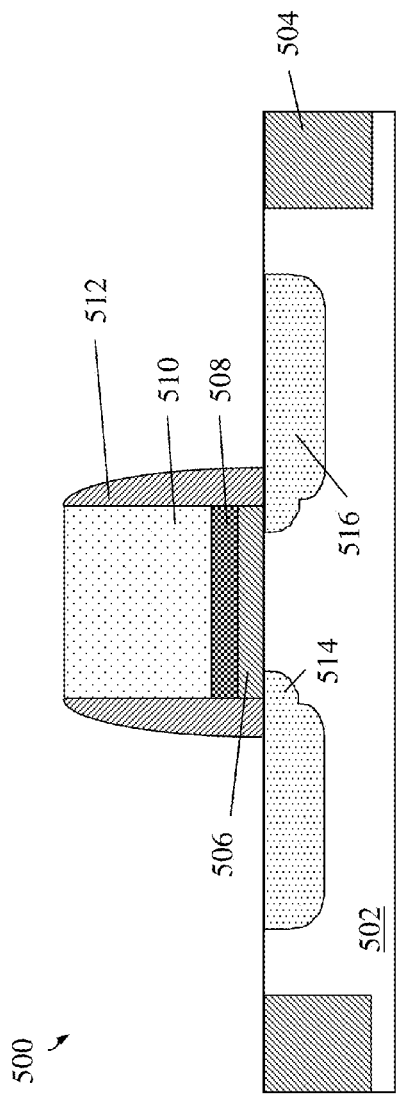

Beginning in block 402, a semiconductor device, such as an FET device that is ready for silicide contact formation is first precleaned with an appropriate solution in order to remove any native oxide formation present as a result of fabrication operations to this point. An exemplary FET device 500 in this regard is shown in FIG. 5. It should be appreciated that the FET device 500 is exemplary only, and that other device combinations and selection of materials are also contemplated. As illustrated in FIG. 5, the FET device 500 is formed over a semiconductor substrate 502, which may include silicon, germanium, silicon germanium, etc. The substrate 502 may be a bulk substrate or a semiconductor-on-insulator substrate, such as a silicon-on-insulator (SOI) substrate. Where transistor device isolation is desired, the substrate 504 may include one or more shallow trench isolation (STI) structures 504 formed therein, from an insulating material such as silicon dioxide for example.

A gate structure of the FET device 500 includes a gate insulating layer 506, which may include a high-k dielectric layer and a gate electrode formed over the gate insulating layer 506. For HKMG technology, the gate electrode may include a gate metal layer (e.g., TiN) 508 formed over the gate insulating layer 506 and a polysilicon layer 510 formed over the gate metal layer 508. The patterned gate structure further includes spacers 512 (e.g., a nitride material) formed along sidewalls thereof. The spacers 512 may, for example, be formed following a first implantation operation to device source/drain extension regions 514 in a channel region below the gate insulating layer 506, and prior to a second implantation operation to form deep source/drain regions 516. Again, it should be appreciated that the FET device 500 to which the present silicide techniques are applied is exemplary only.

Figure 6:
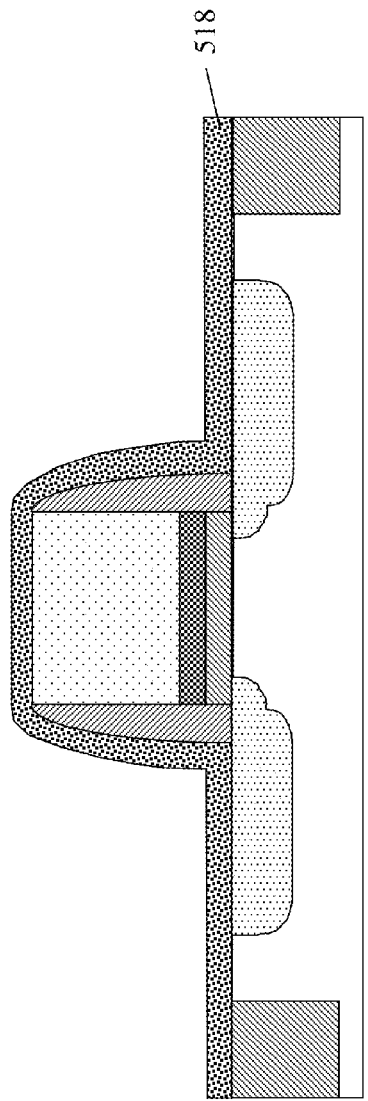
Figure 7:
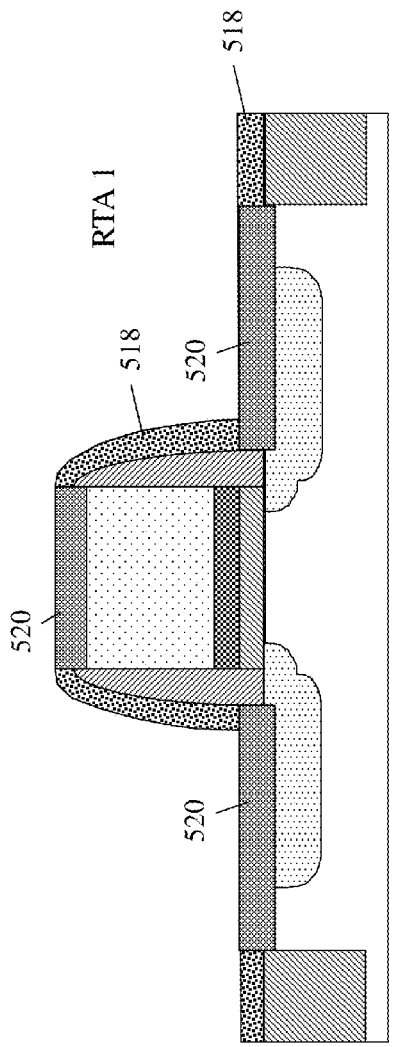

Referring again to FIG. 4, in block 404 following the precleaning, a NiPt alloy layer is formed over the FET device, which may be followed by or include an optional cap layer. The NiPt alloy layer 518, having an exemplary Pt concentration of about 5% to about 30% atomic, is illustrated in FIG. 6, and may be deposited by any suitable technique known in the art. Then, in block 406 of FIG. 4, the device is subjected to a first rapid thermal anneal (RTA 1) at a temperature of about 350° C. or less, and more specifically in a range of about 240° C. to 300° C. As shown in FIG. 7, portions of the NiPt alloy layer 518 in contact with silicon regions react with the silicide layer 518 to form metal rich silicide regions 520. Conversely, portions of the NiPt alloy layer 518 in contact with insulating regions do not react and remain in the NiPt alloy state.

Figure 8:
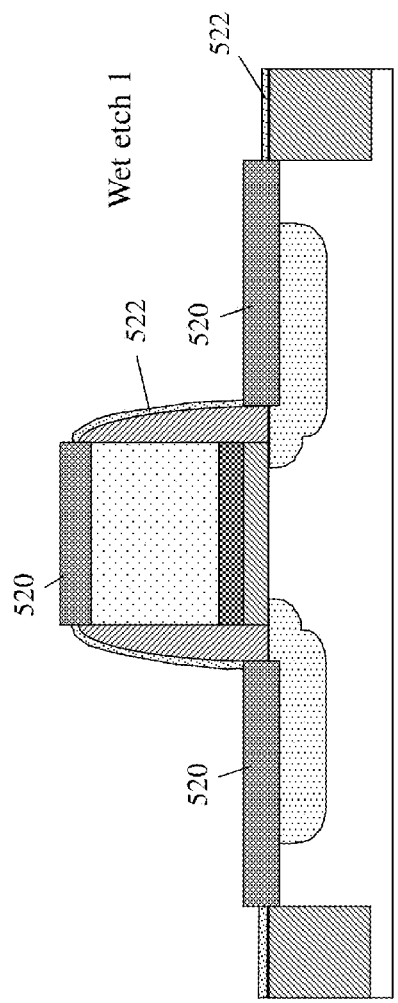

Following RTA 1, a (first wet) metal etch is performed as indicated in block 408 of FIG. 4. In one embodiment, the first wet metal etch may include a standard clean (SC-1) etch, followed by a nitric acid ($HNO_3$) etch, followed by another SC-1 etch. The SC-1 etch may be performed using ammonium hydroxide ($NH_4OH$) and hydrogen peroxide ($H_2O_2$). Alternatively, the first wet metal etch may be performed using SC-1 only. As a result of the first wet metal etch, the nickel constituent of the unreacted NiPt alloy layer is substantially removed (as well as the optional cap layer), leaving behind a Pt-rich residue 522 as shown in FIG. 8. Furthermore, the surfaces of the metal rich silicide regions 520 are passivated by the oxidation aspect of the SC-1 process.

Figure 9:
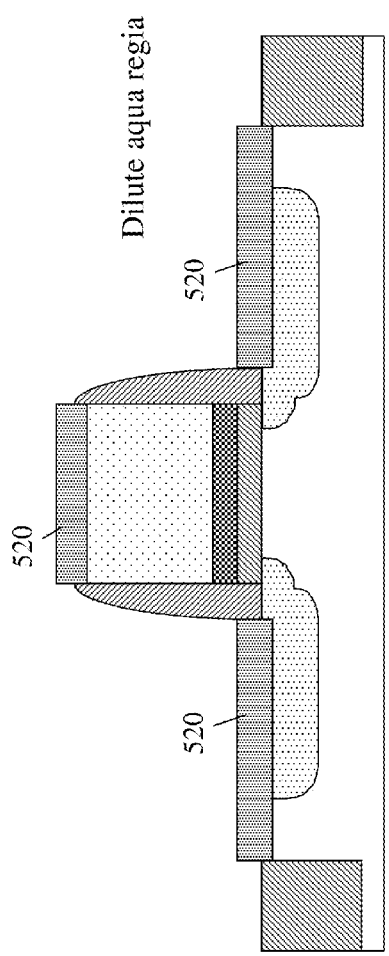

Then, as indicated in block 410 of FIG. 4, a (second wet) dilute Aqua Regia etch is applied for a relatively short duration. In an exemplary embodiment, the dilute Aqua Regia etch is performed for a duration of less than 60 seconds, and more particularly for about 15 seconds. Again, in order to prevent attacking of the metal rich silicide regions, the Aqua Regia chemistry is diluted with water. In one embodiment, a $HNO_3$:HCl:$H_2O$ ratio range may be, for example, 1:10:200 to 1:1:5, and more specifically about 1:5:4. That is, the dilute Aqua Regia etch may be 1 part nitric acid, 5 parts hydrochloric acid and 4 parts water. The temperature of the aqua regia solution may be between about 25° C. to 80° C., and more specifically at about 35° C. FIG. 9 illustrates the structure following the short, dilute Aqua Regia treatment in which the remaining Pt-rich residue is removed, leaving the metal rich silicide regions 520 substantially intact.

Figure 10:
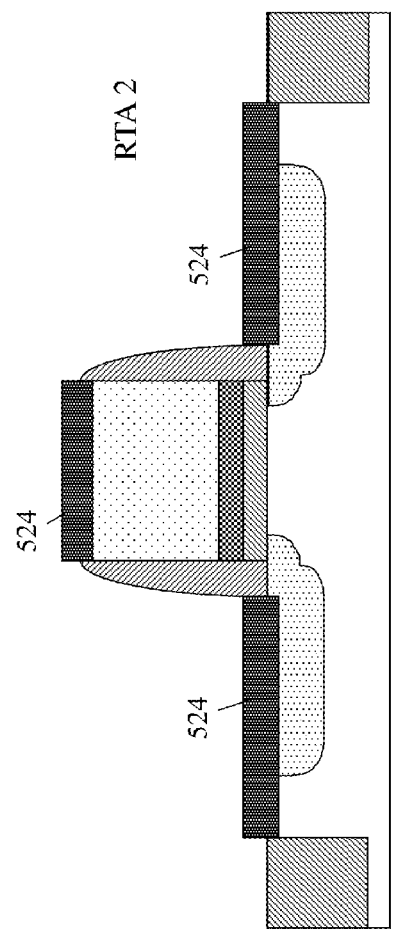

Finally, in block 412 of FIG. 4, a second, higher temperature rapid thermal anneal (RTA 2) is applied in order to form final silicide contact regions. The RTA 2 may be performed, in one embodiment, at a temperature of about 360° C. to about 500° C. for a duration of about 1 to about 60 seconds, and more specifically at about 420° C. for a duration of about 30 seconds. The final silicide contact regions 524 are illustrated in FIG. 10, at which point further processing may continue as known in the art (e.g., dielectric layer and wiring formation, etc.) Optionally, a standard Aqua Regia etch may also be performed at this point, since the final silicide contact regions 524 formed by the higher temperature anneal are more resistant to Aqua Regia attack.

Figure 1:
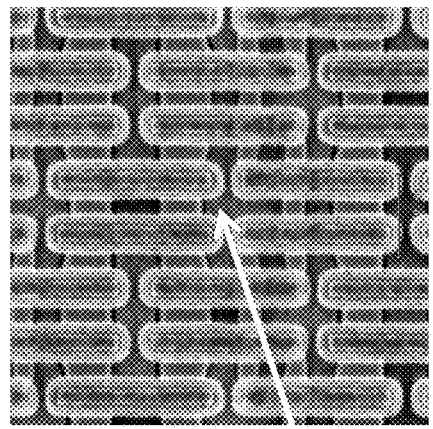
FIG. 1 is a scanning electron microscope (SEM) image illustrating the presence of platinum (Pt) rich residual material following a dilute nitric acid etch of a nickel-platinum (NiPt) silicide layer.
Figure 11:
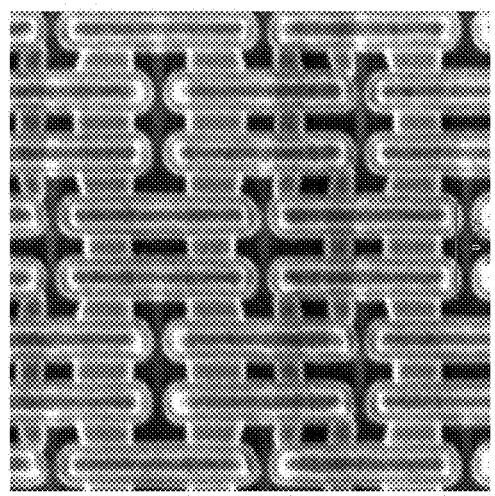
FIG. 11 is an image illustrating the removal the Pt residue with the dilute Aqua Regia etch, in contrast to the image of FIG. 1.

As will be appreciated, a comparison between the image of FIG. 11 (which illustrates the removal the Pt residue) with the dilute Aqua Regia etch, in contrast to the image of FIG. 1 (which illustrates the removal the Pt residue), demonstrates the effectiveness of the above described approach. By employing a quick, dilute Aqua Regia treatment between the first and second RTAs, silicide stringers formed from Pt residue during the second RTA are avoided, thereby increasing device reliability. Moreover, the increased reliability does not come with the tradeoff of metal gate undercutting, or expensive proprietary platinum etch chemistries.

While the disclosure has been described with reference to an exemplary embodiment or embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

The invention claimed is:

1. A method of performing a silicide contact process, the method comprising:
   forming a nickel-platinum alloy (NiPt) layer over a semiconductor device structure;
   performing a first rapid thermal anneal (RTA) so as to react portions of the NiPt layer in contact with semiconductor regions of the semiconductor device structure, thereby forming metal rich silicide regions;
   performing a first wet etch to remove at least a nickel constituent of unreacted portions of the NiPt layer, the first wet etch comprising a standard clean (SC-1) etch using ammonium hydroxide ($NH_4OH$) and hydrogen peroxide ($H_2O_2$), followed by a nitric acid ($HNO_3$) etch, followed by another SC-1 etch to passivate surfaces of the metal rich silicide regions for increased resistance to Aqua Regia attack;
   performing a second wet etch using a dilute Aqua Regia treatment comprising nitric acid ($HNO_3$), hydrochloric acid (HCl) and water ($H_2O_2$) to remove any residual platinum material from the unreacted portions of the NiPt layer; and
   following the dilute Aqua Regia treatment, performing a second RTA to form final silicide contact regions from the metal rich silicide regions.

2. The method of claim 1, wherein the dilute Aqua Regia treatment is performed from a duration of less than 60 seconds.

3. The method of claim 2, wherein the dilute Aqua Regia treatment is performed for about 15 seconds.

4. The method of claim 1, wherein a $HNO_3:HCl:H_2O$ ratio comprises a range of about 1:10:200 to about 1:1:5.

5. The method of claim 4, wherein the $HNO_3:HCl:H_2O$ ratio is about 1:5:4.

6. The method of claim 1, wherein the first RTA is performed at a temperature ranging from about 200° C. to about 350° C. for a duration of about 1 to about 60 seconds.

7. The method of claim 6, wherein the first RTA is performed at a temperature of about 300° C. for a duration of about 5 seconds.

8. The method of claim 7, wherein the second RTA is performed at a temperature of ranging from about 360° C. to about 500° C. for a duration of about 1 to about 60 seconds.

9. The method of claim 8, wherein the second RTA is performed at a temperature of about 420° C. for a duration of about 30 seconds.

10. The method of claim 1, wherein the semiconductor device structure comprises a high-k metal gate (HKMG) field effect transistor (FET).

11. A method of forming a semiconductor device, the method comprising:
    forming a field effect transistor (FET) device on a substrate;
    forming a nickel-platinum alloy (NiPt) layer over the FET device and the substrate;
    performing a first rapid thermal anneal (RTA) so as to react portions of the NiPt layer in contact with semiconductor regions of the FET device, thereby forming metal rich silicide regions;
    performing a first wet etch to remove at least a nickel constituent of unreacted portions of the NiPt layer, the first wet etch comprising a standard clean (SC-1) etch using ammonium hydroxide ($NH_4OH$) and hydrogen peroxide ($H_2O_2$), followed by a nitric acid ($HNO_3$) etch, followed by another SC-1 etch to passivate surfaces of the metal rich silicide regions for increased resistance to Aqua Regia attack;
    performing a second wet etch using a dilute Aqua Regia treatment comprising nitric acid ($HNO_3$), hydrochloric acid (HCl) and water ($H_2O_2$) to remove any residual platinum material from the unreacted portions of the NiPt layer; and
    following the dilute Aqua Regia treatment, performing a second RTA to form final silicide contact regions from the metal rich silicide regions.

12. The method of claim 11, wherein the dilute Aqua Regia treatment is performed from a duration of less than 60 seconds.

13. The method of claim 11, wherein the dilute Aqua Regia treatment is performed for about 30 seconds.

14. The method of claim 13, wherein a $HNO_3:HCl:H_2O$ ratio comprises about 1:5:4.

15. The method of claim 14, wherein the first RTA is performed at a temperature of about 300° C. for a duration of about 5 seconds.

16. The method of claim 15, wherein the second RTA is performed at a temperature of about 420° C. for a duration of about 30 seconds.

17. The method of claim 11, wherein the FET device comprises a high-k metal gate (HKMG) FET.

* * * * *